United States Patent
Fu et al.

(10) Patent No.: US 8,728,335 B2
(45) Date of Patent: May 20, 2014

(54) METHOD AND MATERIALS FOR DOUBLE PATTERNING

(75) Inventors: Peng-Fei Fu, Midland, MI (US); Eric Scott Moyer, Midland, MI (US); Jason D. Suhr, Coleman, MI (US)

(73) Assignee: Dow Corning Corporation, Midland, MI (US)

( * ) Notice: Subject to any disclaimer, the term of this patent is extended or adjusted under 35 U.S.C. 154(b) by 47 days.

(21) Appl. No.: 13/386,510

(22) PCT Filed: Jun. 22, 2010

(86) PCT No.: PCT/US2010/039411
§ 371 (c)(1),
(2), (4) Date: Jan. 23, 2012

(87) PCT Pub. No.: WO2011/011140
PCT Pub. Date: Jan. 27, 2011

(65) Prior Publication Data
US 2012/0118856 A1 May 17, 2012

Related U.S. Application Data

(60) Provisional application No. 61/227,925, filed on Jul. 23, 2009.

(51) Int. Cl.
*B44C 1/22* (2006.01)

(52) U.S. Cl.
USPC .................. 216/41; 216/47; 216/58; 216/67; 430/315; 430/324

(58) Field of Classification Search
USPC .................. 216/41, 47, 58, 67; 430/315, 324
See application file for complete search history.

(56) References Cited

U.S. PATENT DOCUMENTS

| | | | | |
|---|---|---|---|---|
| 6,383,952 B1 * | 5/2002 | Subramanian et al. | ....... | 438/781 |
| 8,282,847 B2 * | 10/2012 | Romano et al. | ................ | 216/47 |
| 2005/0224452 A1 * | 10/2005 | Spiess et al. | .................. | 216/41 |
| 2008/0008954 A1 * | 1/2008 | Abdallah et al. | ........... | 430/270.1 |
| 2008/0067550 A1 | 3/2008 | Lee et al. | | |
| 2008/0124931 A1 | 5/2008 | Lee et al. | | |

(Continued)

FOREIGN PATENT DOCUMENTS

| JP | 2004205699 | 12/2002 |
|---|---|---|
| JP | 2006-117846 | * 5/2006 |

(Continued)

OTHER PUBLICATIONS

Y. Borodovsky, "Marching to the Beat of Moore's Law," SPIE 2006;
L. Peters, "Litho, transistor Changes", Semiconductor International, Jan. 28, 2008, p. 23.

(Continued)

*Primary Examiner* — Shamim Ahmed
(74) *Attorney, Agent, or Firm* — Baltazar Gomez

(57) ABSTRACT

A silsesquioxane resin is applied over the patterned photoresist and cured at the pattern surface to produce a cured silsesquioxane resin on the pattern surface. The uncured silsesquioxane resin layer is then removed leaving the cured silsesquioxane resin on the pattern surface. The cured silsesquioxane resin on horizontal surfaces is removed to expose the underlying photo-resist. This photo-resist is removed leaving a pattern of cured silsesquioxane. Optionally, the new pattern can be transferred into the underlying layer(s).

18 Claims, 1 Drawing Sheet

(56) References Cited

U.S. PATENT DOCUMENTS

| | | |
|---|---|---|
| 2008/0199814 A1 | 8/2008 | Brzozowy et al. |
| 2008/0299494 A1 | 12/2008 | Bencher et al. |
| 2009/0087959 A1* | 4/2009 | Ban ................................ 438/401 |
| 2009/0280438 A1* | 11/2009 | Kohno et al. ................. 430/323 |

FOREIGN PATENT DOCUMENTS

| | | | |
|---|---|---|---|
| JP | 201020109 | | 1/2010 |
| JP | 2010169894 | | 8/2010 |
| KR | 2007213653 | | 8/2007 |
| KR | 2008072097 | | 3/2008 |
| WO | WO 2009068754 | * | 6/2009 |

OTHER PUBLICATIONS

T. Mamoru ; K. Teruhiko; et al, "Newly developed RELACS materials and process for 65 nm nodes", SPIE,2006,6153 (2).

Huixiong Dai, Chris Bencher, Yongmei Chen, Hyungje Woo, Chris Ngai, and Xumou Xu, "45nm and 32nm half-pitch patterning with 193nm dry lithography and double patterning", Proc. SPIE, vol. 6924, 692421 (2008).

Chris Bencher, Yongmei Chen, Huixiong Dai, "22nm half-pitch patterning by CVD spacer self alignment double patterning (SADP)", Proc. SPIE, vol. 6924, 69244E (2008).

JP2012-521647, Official Decision of Refusal, Jun. 4, 2013.

JP2012-521647, Official Decision of Refusal, Aug. 21, 2012.

* cited by examiner

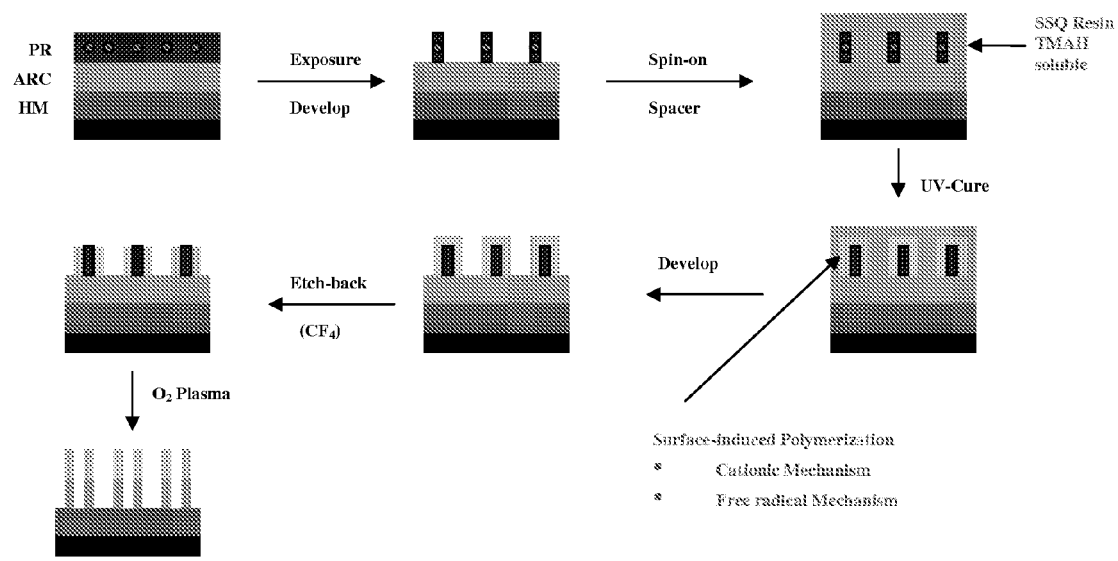

METHOD AND MATERIALS FOR DOUBLE PATTERNING

CROSS REFERENCE TO RELATED APPLICATIONS

This application is a U.S. national stage filing under 35 U.S.C. §371 of PCT Application No. PCT/US10/39411 filed on Jun. 22, 2010, currently pending, which claims the benefit of U.S. Provisional Patent Application No. 61/227,925 filed Jul. 23, 2009 under 35 U.S.C. §119 (e). PCT Application No. PCT/US10/39411 and U.S. Provisional Patent Application No. 61/227,925 are hereby incorporated by reference.

BACKGROUND OF THE INVENTION

In the microelectronics industry, the requirements for increased circuitry for a given chip size has driven to smaller half-pitch nodes in order to increase the process speed and improve the chip efficiency. Microlithography techniques are key to reducing the size of structural features. The depth of focus and resolution depend on the numerical aperture of the lithography apparatus and the wavelength of light.

Double Patterning is a class of technologies developed for photolithography to enhance the feature density. For the semiconductor industry, double patterning may be the only lithography technique to be used for the 32 nm and 22 nm half-pitch nodes using the 193 nm immersion lithograph tools available today. There are four common schemes available to double patterning: (1) double exposure; (2) self-aligned spacer mask; (3) heterogeneous mask; and (4) immediate pattern accumulation. Among these, self-aligned spacer mask is probably the most promising technology however, the process is very sophisticated and involves many complex steps. Typically a spacer material is firstly formed on the sidewall of a pre-patterned feature, applied either by a spin-on or deposition process, followed by etching to remove all the film material on the horizontal surface, leaving only the sidewalls. After removing the original patterned feature, only the spacer is left. Since there are two spacers for every line, the line density is doubled.

In order for a silicon containing material to be useful in double patterning, it must meet several criteria. First it must be in a solvent that the photo-resist is not soluble in such as an organic alcohol or ether. Additionally, it must be capable of being cured by multiple cure methods to allow for the formation of select compositions that can be etched by different etch methods such as $CF_4$ and $O_2$. It has been found that certain silsesquioxane resins meet these criteria.

BRIEF SUMMARY OF THE INVENTION

This invention pertains to the use of coating compositions comprising a silsesquioxane resin in producing patterns on a substrate, typically an electronic device. In this process one starts with a substrate having a patterned photo-resist layer thereon. The coating composition is applied over the patterned photo-resist and cured at the pattern surface to produce a cured silsesquioxane resin on the pattern surface. The uncured silsesquioxane resin layer is then removed leaving the cured silsesquioxane resin on the pattern surface. The cured silsesquioxane resin on horizontal surfaces is removed to expose the underlying photo-resist. This photo-resist is removed leaving a pattern of cured silsesquioxane. Optionally, the new pattern can be transferred into the underlying layer(s).

BRIEF DESCRIPTION OF THE DRAWINGS

FIG. 1 represents the process steps of forming a pattern on a substrate using a silsesquioxane resin using a method of double patterning.

DETAILED DESCRIPTION OF THE INVENTION

Disclosed herein is a method for forming a pattern on a substrate wherein the method comprises
(I) applying a coating composition over a first patterned material containing an activator selected from a thermal acid generator, a photo acid generator or an amine crosslinker wherein the coating composition comprises a silsesquioxane resin comprised of the units

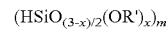

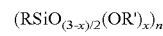

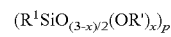

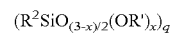

wherein R' is hydrogen atom or a hydrocarbon group having from 1 to 4 carbon atoms; R is a photocurable group selected from groups containing epoxy; groups containing acryloxy functionality, and a vinylether group; $R^1$ is a hydrophilic organic group; $R^2$ is any organic auxiliary group; x has a value of 0, 1 or 2; wherein in the resin m has a value of 0.10 to 0.95, n has a value of 0.05 to 0.7; p has a value of 0.05 to 0.5; q has a value of 0 to 0.5; and $m+n+p+q\approx1$;
(II) exposing the coating composition to a cure mechanism to produce a cured coating on the surface of the first pattern material;
(III) removing any uncured coating composition;
(IV) removing the cured coating from any horizontal surfaces resulting in cured coating on sidewalls of the first pattern material; and
(V) removing the first pattern material thereby producing a second pattern on the substrate wherein the second pattern comprises the cured coating composition.

The silsesquioxane resins are comprised of the units

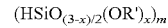

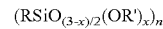

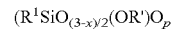

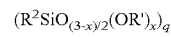

wherein R' is hydrogen atom or a hydrocarbon group having from 1 to 4 carbon atoms; R is a photocurable group selected from groups containing epoxy functionality such as the 3-glycidoxypropyl group or 2-(3,4-epoxycyclohexyl)-ethyl-group; groups containing acryloxy functionality such as methacryloxypropyl group, an acryloxypropyl group, and a vinylether group; $R^1$ is a hydrophilic organic group, selected, but not limited, from polyethylene glycol group, sulfonate group, phosphate group; $R^2$ is any organic auxiliary group including methyl, phenyl groups; x has a value of 0, 1 or 2; wherein in the resin m has a value of 0.10 to 0.95, n has a value of 0.05 to 0.7; p has a value of 0.05 to 0.5; q has a value of 0 to 0.5; and $m+n+p+q\approx1$. Typically m has a value of 0.2 to 0.90, alternatively 0.3 to 0.85. Typically n has a value of 0.05 to 0.50, alternatively 0.1 to 0.3. Typically p has a value of 0.05 to 0.30, alternatively 0.1 to 0.20. Typically q has a value of 0 to 0.25, alternatively 0.01 to 0.20.

R' is independently a hydrogen atom or hydrocarbon group having 1 to 4 carbon atoms. R' may be exemplified by H, methyl, ethyl, propyl, iso-propyl, n-butyl, and tert-butyl. Typically R' is H or methyl.

R is a photocurable organic group. The photocurable organic groups may be exemplified by, but not limited to a group containing epoxy functionality, a group containing acryloxy functionality or a vinylether group. Groups containing epoxy functionality may be represented by the formula —$R^2OCH_2CH(O)CH_2$, where $R^2$ is hydrocarbon group having 1 to 4 carbon atoms or a polyether group or —$CH_2CH_2$—($C_6H_9(O)$). Groups containing epoxy functionality may be exemplified by 3-glycidoxypropyl group or 2-(3,4-epoxycyclohexyl) group. Groups containing acryloxy functionality represented by the formula $CH_2$=$C(R^3)COOR^4$—, where $R^3$ is hydrogen atom or a methyl group and $R^4$ is hydrocarbon group having 1 to 4 carbon atoms or a polyether group. Groups containing acryloxy functionality may be exemplified by, but not limited to, methacryloxypropyl or acryloxypropy. The vinylether group may be represented by —O—CH=$CH_2$.

$R^1$ is a hydrophilic group. Hydrophilic groups may be exemplified by, but not limited to, polyethylene glycol group, sulfonate group, phosphate group.

Examples of resins useful herein may be exemplified by, but not limited to:

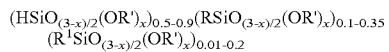

where R is ethyl-cyclohexene oxide (CHEp) and $R^1$ is polyethylene oxide (PEO) and R' is H or alkyl group; or

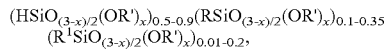

where R is methacrylate group (MA) and $R^1$ is PEO and R' is H or alkyl group.

The silsesquioxane resin may be produced by any method known in the art. For example, the silsesquioxane resin may be produced by the hydrolysis and/or condensation of the appropriate silanes. By this method it is possible that residual —OH and/or —OR' will remain in the silsesquioxane resin as a result of incomplete hydrolysis or condensation. If the total amount of units in the silsesquioxane resin containing —OR' groups, exceed 70 mole % then gellation and instability of the resin may occur. Typically the silsesquioxane resin contains 6 to 60 mole % of units containing —OR' groups, depending upon the synthetic routes.

Another method for producing the silsesquioxane resin is the by the reaction of a hydrosilsesquioxane (HSQ), with a R group containing C=C functionality in the presence of a hydrosilylation catalyst;

Another method for the producing the silsesquioxane resin is by the reaction of $(HSiO_{(3-x)/2}(OR')_x)_m$ $(R^2SiO_{(3-x)/2}(OR')_x)_n$ with a R group containing C=C functionality and an $R^1$ group containing C=C functionality, in the presence of a hydrosilylation catalyst; where m' has a value of 0.30 to 1.0; and $R^2$ is as described above.

The silsesquioxane resin has a weight average molecular weight (Mw) in the range of 500 to 200,000, alternatively in the range of 500 to 100,000, alternatively in the range of 700 to 30,0000 as determined by gel permeation chromatography employing $R^1$ detection and polystyrene standards.

The silsesquioxane resin is typically produced in the presence of a solvent. Any suitable organic or silicone solvent that does not contain a functional group other than alcohol which may participate in the hydrolysis and/or condensation reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propionate; alcohols such as methanol, ethanol, and isopropanol. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with 15° C. to 110° C. suggested.

The time to form the silsesquioxane resin is dependent upon a number of factors such as the temperature, the type and amount of reactants, and the amount of catalyst. Typically the reaction time is from several minutes to several hours. One skilled in the art will be able to readily determine the time necessary to complete the reaction. Acid catalysts that may be used to facilitate the reaction include, but are not limited to, nitric acid, sulfuric acid, sulfonic acid, hydrochloric acid, acetic acid, and others. Base catalysts that may be used to facilitate the reaction include, but are not limited to, sodium hydroxide, potassium hydroxide, cesium hydroxide, tetramethylammonium hydroxide, triethylamine, among others.

Following completion of the reaction the catalyst may be optionally removed. Methods for removing the catalyst are well know in the art and would include neutralization, stripping or water washing or combinations thereof. Large amounts of catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form or desired concentration. For example, the silsesquioxane resin may be concentrated by removing the solvent. The method of solvent removal is not critical and numerous methods are well known in the art (e.g. distillation under heat and/or vacuum). Once the concentration of the silsesquioxane resin reaches to a certain concentration, the resin can be diluted with the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

The coating composition typically contains a solvent. Useful solvents (iii) include, but are not limited to, 1-methoxy-2-propanol, 4-methyl-2-pentanol, propylene glycol monomethyl ethyl acetate, γ-butyrolactone, and cyclohexanone, among others. The coating composition typically comprises from 10% to 99.9 wt % solvent based on the total weight of the coating composition, alternatively 80 to 98 wt %.

The coating composition is applied on a substrate having a pattern thereon. Typically the substrate is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

The pattern on the semiconductor device is typically a photo-resist layer that has been applied and patterned. Typically the patterned photo-resist is formed over an antireflective coating which is formed over a hardmask as seen in FIG. 1. Methods for applying the photo-resist, antireflective coating and hardmask layers are known in the art. Methods for producing a pattern in the photo-resist layer are also known in the art.

The photo-resist layer comprises an activator selected from a thermal acid generator, photoacid generator or an amine crosslinker.

A thermal acid generator is a compound which is capable of generating an acidic moiety when heated, e.g., during the baking step or the resist flow process. Thermal acid generators can be nonionic thermal acid generator, ionic acid generator or polymeric acid generators. Exemplary nonionic thermal acid generators include but no limit to cyclohexyl p-toluenesulfonate, menthyl p-toluenesulfonate and cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, the alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and mixtures thereof. Ionic thermal acid generators include but not limit to dodecylbenzenesulfonic acid triethylamine salt, dodecylbenzenedisulfonic acid triethylamine salt, sulfonate salts, such as carbocyclic aryl (e.g. phenyl, napthyl, anthracenyl, etc.), heteroaryl (e.g. thienyl) or aliphatic sulfonate salts, preferably carbocyclic aryl sulfonate salts, optionally substituted benzenesulfonate salts, etc. The carbocyclic aryl sulfonate salts can be unsubstituted or substituted by, for example, one or more of hydroxy; optionally substituted alkyl; optionally substituted alkenyl; optionally substituted alkoxy; optionally substituted carbocyclic aryl e.g. optionally substituted phenyl, optionally substituted naphthyl, optionally substituted anthracene and the like; optionally substituted aralkyl such as aralkyl e.g. optionally substituted benzyl and the like; and optionally substituted heteroaromatic or heteroalicyclic groups preferably having 1 to 3 rings, 3 to 8 ring members in each ring and from 1 to 3 heteroatoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperidinyl, morpholino, pyrrolindinyl; and others.

A photo acid generator is a compound which is capable of generating an acidic moiety when exposed to UV, e.g., during the baking step or the resist flow process. Photoacid generators include sulfide and onium type compounds. Photo acid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

An amine crosslinker is a compound which is capable of generating amine when heated or exposed to UV, e.g., during the baking step or the resist flow process. Exemplary amine crosslinkers include but not limited to glycoluril-formaldehyde resins, melamine-formaldehyde resins, benzoguanamine-formaldehyde resins, and urea-formaldehyde resins, N,N,N,N-tetra(alkoxymethyl)glycoluril, N,N,N,N-tetra(alkoxymethyl)glycoluril, N,N,N,N-tetra(methoxymethyl)glycoluril, N,N,N,N-tetra(ethoxymethyl)glycoluril, N,N,N,N-tetra(n-propoxymethyl)glycoluril, N,N,N,N-tetra(t-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl)glycoluril is available under the trademark POWDERLINK from Cytec Industries (e.g., POWDERLINK 1174).

Typically the activator is present in the photo-resist in an amount of up to 20,000 ppm, alternatively 10 to 10,000 ppm, based on the total weight of the photo-resist.

Specific methods for application of the coating composition to the substrate include, but are not limited to, spin-coating, dip-coating, spay-coating, flow-coating, screen-printing and others. The typical method for application is spin coating. Typically, coating involves spinning the electronic device, at 1,000 to 2,000 RPM, and adding the coating composition to the surface of the spinning electronic device.

Once the coating composition has been applied any solvent is removed and the coating composition exposed to a curing mechanism to activate the activator in the photo-resist and cause the coating composition to cure at the surface of the photo-resist. Depending on the functional group on the silsesquioxane resin and the activator in the composition the curing mechanism may be by thermal or radiation.

To thermal cure the coating composition, the coated substrate is heated to a sufficient temperature for a sufficient duration to lead to curing. Curing may take place for example by heating the coating composition at 80° C. to 250° C. for 0.1 to 60 minutes, alternatively 100° C. to 150° C. for of 0.5 to 5 minutes, alternatively 100° C. to 130° C. for 0.5 to 2 minutes. Any method of heating may be used during the curing step. For example, the coated electronic device may be placed in a quartz tube furnace, convection oven or allowed to stand on hot plates.

Radiation curing occurs when the coating composition is exposed to a radiation source such as UV, X-ray, e-beam, EUV, or the like. Typically ultraviolet radiation having a wavelength of 200 nm to 450 nm is used alternatively ultraviolet radiation having a wavelength of 245 nm or 365 nm is used. Suitable radiation sources include mercury, mercury/xenon, and xenon lamps. The preferred radiation source is a KrF excimer laser (248 nm). At longer wavelength radiation is used, e.g., 365 nm, it is suggested to add a sensitizer to the photoresist composition to enhance absorption of the radiation. Full exposure of the coating composition is typically achieved with less than 100 mJ/cm$^2$ of radiation, alternatively with less than 50 mJ/cm$^2$ of radiation.

The amount of coating composition that cures will depend upon the amount of activator in the photo-resist and the time that the coating composition is exposed to the curing mechanism. When the coating composition is exposed to a radiation source, it may be desirable to carry out an subsequent thermal treatment to promote the cure in the resin.

Once the curing has taken place, the uncured coating composition may be removed with a developer solution. Suitable developer solutions typically contain an aqueous base solution, typically an aqueous base solution without metal ions, and optionally an organic solvent. One skilled in the art will be able to select the appropriate developer solution. Standard industry developer solutions may be exemplified by, but not limited to organic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butyllamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide and choline, and cyclic amines such as pyrrole and piperidine. Typically, solutions of quaternary ammonium salt such as tetramethylammonium hydroxide (TMAH) is used.

After the uncured coating composition has been removed there is a left a layer of cured coating composition over the patterned photo-resist. The horizontal surfaces of the cured coating composition are then removed to leaving cured coating composition on the sidewalls of the photo-resist. The cured coating composition may be removed by known reactive ion etching techniques, such as $CF_4$.

The photo-resist layer may then be removed by known techniques such as by etching with reactive ions such as oxygen, plasma, and/or oxygen/sulfurdioxide plasma. Suitable plasma tools include, but are not limited to, electron cyclotron resonance (ECR), helicon, inductively coupled plasma, (ICP) and transmission-coupled plasma (TCP) system. Etching techniques are well known in the art and one skilled in the art will be familiar with the various commercially available etching equipments.

Additional steps or transferring the pattern into the underlying layers may be employed to produce a device having the desired architecture.

EXAMPLES

The following examples are included to demonstrate embodiments of the invention. It should be appreciated by those of skill in the art that the techniques disclosed in the examples which follow represent techniques discovered by the inventor to function well in the practice of the invention, and thus can be considered to constitute typical modes for its practice. However, those of skill in the art should, in light of the present disclosure, appreciate that many changes can be made in the specific embodiments which are disclosed and still obtain a like or similar result without departing from the invention. All percentages are in wt. %.

Example 1

Synthesis of $T(H)_{0.65}T(CHEp)_{0.3}T(PEO)_{0.05}$

To a 500 mL flask containing hydrosilsesquioxane in toluene (Mw=2200, 212 g, 12.5% wt in toluene), allyl monomethyl polyethylene glycol (18.75 g), and vinyl cyclohexene oxide (18.63 g) were added a few drops of a platinum catalyst. The mixture was stirred for two hours at 80° C. The solution of the selected solvent was obtained by solvent-exchange to 10% weight. The solution was filtered through a 0.2 micron PTFE filter and stored in a HDPE bottle. GPC (vs. PS): Mw=4360, PDI=3.04.

Example 2

Synthesis of $T(H)_{0.55}(MA)_{0.30}T(PEO)_{0.15}$

To a three-necked 3 L flask were loaded with ethyl acetate (100 g), $Me(OCH_2CH_2)_{5-9}O(CH_2)_3SiCl_3$ (28.84 g), methacryloxypropyltrimethoxysilane (37.25 g), and $HSiCl_3$ (37.25 g). A solution of ethyl acetate (300 g) and water (27 g) was added to the flask over a one-hour period. The solution was allowed to body for one hour. The resin solution was then washed with DI-water and solvent exchanged to iso-butanol using a rotary evaporator. The solution was stripped and diluted to 10 wt % in i-butanol. The solution was filtered through a 0.2 micron PTFE filter and stored in a HDPE bottle. GPC (vs. PS): Mw=9530, PDI=2.02.

Example 3

Synthesis of $T(H)_{0.6}T(CHEp)_{0.3}T(PEO)_{0.1}$

To a 500 mL flask containing hydrosilsesquioxane in toluene (424 g, Mw=2200, 12.5% wt in toluene), ally monomethyl polyethylene glycol (25 g), and vinyl cyclohexene oxide (37.26 g) were added a few drops of a platinum catalyst. The mixture was stirred for two hours at RT. The solution of the selected solvent was obtained by solvent-exchange to 10% weight. The solution was filtered through a 0.2 micron PTFE filter and stored in a HDPE bottle. GPC (vs. PS): Mw=8900, PDI=4.26.

Example 4

Synthesis of $T(H)_{0.85}T(CHEp)_{0.15}T(PEO)_{0.05}$

To a 500 mL flask containing hydrosilsesquioxane in toluene (153.2 g, Mw=2200, 12.5% wt in toluene), ally monomethyl polyethylene glycol (6.25 g), and vinyl cyclohexene oxide (9.31 g) were added a few drops of a platinum catalyst. The mixture was stirred for two hours at RT. The solution of the selected solvent was obtained by solvent-exchange to 10% weight. The solution was filtered through a 0.2 micron PTFE filter and stored in a HDPE bottle. GPC (vs. PS): Mw=4360, PDI=3.04

Example 5

Synthesis of $T(H)_{0.85}T(CHEp)_{0.15}T(PEO)_{0.05}$

To a 500 mL flask containing hydrosilsesquioxane in toluene (306 g, Mw=2200, 12.5% wt in toluene), ally monomethyl polyethylene glycol (12.5 g), and vinyl cyclohexene oxide (18.63 g) were added a few drops of a platinum catalyst. The mixture was stirred for two hours at RT. The solution of the selected solvent was obtained by solvent-exchange to 10% weight. The solution was filtered through a 0.2 micron PTFE filter and stored in a HDPE bottle. GPC (vs. PS): Mw=4370, PDI=2.98

Example 6

Synthesis of T(H)$_{0.85}$T(CHEP)$_{0.15}$T(HOP)$_{0.05}$

To a 250 mL flask containing hydrosilsesquioxane in toluene (37.6 g, Mw=2200, 23.5% wt in toluene), 2-allyoxytetrahydropyran (HOP, 6.62 g), and vinyl cyclohexene oxide (4.13 g) were added a few drops of a platinum catalyst in an ether solvent. The mixture was stirred for a few hours at RT. The solution of the selected solvent was obtained by solvent-exchange to 10% weight. The solution was filtered through a 0.2 micron PTFE filter and stored in a HDPE bottle. GPC (vs. PS): Mw=6730, PDI=3.21

Resin Formulation, Coating and Characterization

Depending on the resin, a weighted amount of a photo-initiator, either a photoacid generator (PAG), (p-isopropylphenyl)(p-methylphenyl)iodonium tetrakis(pentafluorophenyl) borate, or a photoradical generator (PRG), Irgacure 379 from Ciba Special Chemicals, was dissolved in 10% wt. of a resin solution (Table 1). The film coating on wafers was processed on a Karl Suss CT62 spin coater. The resin solution was first filtered through a 0.2 micron TEFLON filter and then spin coated onto standard single side four inch polished low resistively wafers or double sided polished FTIR wafers (spin speed=2000 rpm; acceleration speed=5000, time=20 seconds unless otherwise indicated). The wafer was prebaked at 120° C. for 60 seconds, followed by a broadband UV irradiation (the UV dosage is shown in Table 1 in J/m²). The wafer was then post-baked at 120° C. for 60 seconds. Afterwards, the cured wafer was immersed into TMAH solution (0.24 N) for 60 seconds. Film loss by TMAH developer (%) after photo-cure was determined by measuring the film thickness change before and after immersing the cured wafer in TMAH (0.24 N) for 1 min using a J. A. Woollam ellipsometer. The thickness values recorded were the average of nine measurements.

The invention claimed is:

1. A method for forming a pattern on a substrate wherein the method comprises
    (I) applying a coating composition over a first patterned material containing an activator selected from a thermal acid generator, a photo acid generator or an amine crosslinker wherein the coating composition comprises a silsesquioxane resin comprised of the units $(HSiO_{(3-x)/2}(OR')_x)_m$ $(RSiO_{(3-x)/2}(OR')_x)_n$ $(R^1SiO_{(3-x)/2}(OR')_x)_p$ $(R^2SiO_{(3-x)/2}(OR')_x)_q$ wherein R' is hydrogen atom or a hydrocarbon group having from 1 to 4 carbon atoms; R is a photocurable group selected from groups containing epoxy; groups containing acryloxy functionality, and a vinylether group; $R^1$ is a hydrophilic organic group; $R^2$ is any organic auxiliary group; x has a value of 0, 1 or 2; wherein in the resin m has a value of 0.10 to 0.95, n has a value of 0.05 to 0.7; p has a value of 0.05 to 0.5; q has a value of 0 to 0.5; and m+n+p+q≈1;
    (II) exposing the coating composition to a cure mechanism to produce a cured coating on the surface of the first pattern material;
    (III) removing any uncured coating composition;
    (IV) removing the cured coating from any horizontal surfaces resulting in cured coating on sidewalls of the first pattern material; and
    (V) removing the first pattern material thereby producing a second pattern on the substrate wherein the second pattern comprises the cured coating composition.

TABLE 1

Photo-curable properties of silsesquixane materials

| Example # | Composition (mole %) | Solvent[a] | Photoinitiator[b] | Cure condition[c] | Th (A) | SD | Film Loss (%) By TMAH |
|---|---|---|---|---|---|---|---|
| 1A | T(H)$_{0.65}$T(CHEp)$_{0.3}$T(PEO)$_{0.05}$ | HexOH | PAG | as spun | 2009 | 4.3 | 99.45% |
| 1B | | HexOH | PAG | 120-5J-120 | 1691 | 4.3 | 6.62% |
| 1C | | IPA | PAG | 120-5J-120 | 3385 | 15.9 | 4.58% |
| 1D | | EtOH | PAG | 120-5J-120 | 3135 | 84.5 | 1.91% |
| 1E | | i-BuOH | PAG | 120-5J-120 | 3041 | 159.3 | 2.70% |
| 1F | | PGBE | PAG | 120-5J-120 | 1848 | 5.1 | 1.00% |
| 2A | T(H)$_{0.55}$(MA)$_{0.30}$T(PEO)$_{0.15}$ | i-BuOH | PRG | As spun | 2286 | 58.4 | 99.80% |
| 2B | | i-BuOH | PRG | 120-10J-120 | 2683 | 79.4 | 26.54% |
| 3A | T(H)$_{0.6}$T(CHEp)$_{0.3}$T(PEO)$_{0.1}$ | PGBE | PAG | As spun | 1798 | 6.2 | 100% |
| 3B | | PGBE | PAG | 120-5J-120 | 1808 | 2.4 | 0.77% |
| 4A | T(H)$_{0.85}$T(CHEP)$_{0.15}$T(PEO)$_{0.05}$ | IPE | PAG | As spun | 1367 | 12 | 99.90% |
| 4B | | IPE | PAG | 120-5J-120 | 1248 | 10 | 2.88% |
| 5A | T(H)$_{0.85}$T(CHEp)$_{0.15}$T(PEO)$_{0.05}$ | PGBE | PAG | 120-5J-120 | 1562 | 4 | 3.91% |
| 5B | | iBuOH | PAG | 120-5J-120 | 3091 | 14 | 2.46% |
| 6A | T(H)$_{0.85}$T(CHEp)$_{0.15}$T(HOP)$_{0.05}$ | IPE | PAG | 120-5J-120 | 1427 | 9.9 | 0.77% |
| 6B | | IPE | PAG | 120-5J-120 | 1345 | 8.8 | 0.89% |

[a]Solvent: HexOH = 1-hexanol; IPA = isopropanol; i-BuOH = isobutanol; PGBE = propylene glycol 1-monobutyl ether; IPE = di(isopentyl) ether;
[b]Photoinitiator: PAG (photo-acid generator) = 0.85% wt in solution; PRG (photo-radical generator) = (3% wt in solution);
[c]Cure conditions: prebake at 120 C. for 60 seconds- irradiation (UV broadband)-postbake at 120 for 60 seconds;

2. The method as clamed in claim 1 wherein m has a value of 0.2 to 0.90, n has a value of 0.05 to 0.50, p has a value of 0.05 to 0.30, and q has a value of 0 to 0.25.

3. The method as claimed in claim 1 wherein m has a value of 0.3 to 0.85, n has a value of 0.1 to 0.3, p has a value of 0.1 to 0.20, and q has a value of 0.01 to 0.20.

4. The method as claimed in claim 1, wherein R is an epoxy group having the formula —$R^2OCH_2CH(O)CH_2$, where $R^2$ is hydrocarbon group having 1 to 4 carbon atoms or a polyether group or —$CH_2CH_2$—($C_6H_9(O)$).

5. The method as claimed in claim 4 wherein R is a 3-glycidoxypropyl group.

6. The method as claimed in claim 4 wherein R is 2-(3,4-epoxycyclohexyl) group.

7. The method as claimed in claim 1, wherein R is and acryloxy group having the formula $CH_2$=$C(R^3)COOR^4$—, where $R^3$ is hydrogen atom or a methyl group and $R^4$ is hydrocarbon group having 1 to 4 carbon atoms or a polyether group.

8. The method as claimed in claim 7 wherein R is methacryloxypropyl.

9. The method as claimed in claim 7 wherein R is acryloxypropy.

10. The method as claimed in claim 1, wherein R is a vinylether group.

11. The method as claimed in claim 1 wherein the coating composition also comprises a solvent.

12. The method as claimed in claim 1 wherein the coating composition is thermally cured by heating the coating composition.

13. The method as claimed in claim 1 wherein the coating composition is cured by exposing the composition to radiation.

14. The method as claimed in claim 1 wherein any uncured coating composition is removed with a developer solution.

15. The method as claimed in claim 1 wherein the cured coating is removed from any horizontal surfaces by a reactive ion etching technique.

16. The method as claimed in claim 1 wherein the cured coating is removed by etching with $CF_4$.

17. The method as claimed in claim 1 wherein the first patterned material is removed by etching.

18. The method as claimed in claim 1 wherein the first patterned material is removed by etching with $O_2$ plasma.

* * * * *